(12) United States Patent
Hirano et al.

(10) Patent No.: US 10,229,819 B2
(45) Date of Patent: Mar. 12, 2019

(54) PLASMA PROCESSING APPARATUS AND PROBE APPARATUS

(71) Applicant: Tokyo Electron Limited, Tokyo (JP)

(72) Inventors: Taichi Hirano, Miyagi (JP); Kenji Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 251 days.

(21) Appl. No.: 14/399,309

(22) PCT Filed: May 27, 2013

(86) PCT No.: PCT/JP2013/064649
§ 371 (c)(1),
(2) Date: Nov. 6, 2014

(87) PCT Pub. No.: WO2013/187218
PCT Pub. Date: Dec. 19, 2013

(65) Prior Publication Data
US 2015/0114563 A1 Apr. 30, 2015

Related U.S. Application Data

(60) Provisional application No. 61/663,037, filed on Jun. 22, 2012.

(30) Foreign Application Priority Data

Jun. 11, 2012 (JP) .................... 2012-132030

(51) Int. Cl.
*H01J 37/32* (2006.01)
*H05H 1/46* (2006.01)
*H01L 21/67* (2006.01)

(52) U.S. Cl.
CPC .... *H01J 37/3299* (2013.01); *H01J 37/32082* (2013.01); *H01J 37/32146* (2013.01);
(Continued)

(58) Field of Classification Search
CPC ............. H01J 37/3299; H01J 37/32183; H01J 37/32146; H01J 2237/334;
(Continued)

(56) References Cited

U.S. PATENT DOCUMENTS

| 5,097,430 A | * | 3/1992 | Birang | H01J 37/3266 204/298.32 |
| 2009/0242132 A1 | * | 10/2009 | Sato | H01J 37/32091 156/345.43 |
| 2011/0031216 A1 | * | 2/2011 | Liao | H01J 37/32082 216/67 |

FOREIGN PATENT DOCUMENTS

| JP | 07-014696 A | | 1/1995 |
| JP | 2002270574 A | * | 9/2002 |

(Continued)

OTHER PUBLICATIONS

International Search Report for PCT/JP2013/064649 dated Aug. 6, 2013.

*Primary Examiner* — Yuechuan Yu
(74) *Attorney, Agent, or Firm* — Pearne & Gordon LLP

(57) ABSTRACT

A plasma processing apparatus includes a high frequency power supply turning a high frequency power ON/OFF and supplying the high frequency power to either one of upper and lower electrodes. A matching circuit and a power transmission line are provided between the high frequency power supply and the either one of the electrodes. A probe detector measures electrical characteristics on the power transmission line and generates measurement signals. A processing unit samples the measurement signals, generates sample values, The processing unit receives a pulse signal (Continued)

corresponding to ON/OFF switching of the high frequency power, generates sample values by sampling the measurement signals at a sampling interval for a period after the lapse of a mask period from an ascending timing thereof until a descending timing thereof, and selects sample values obtained through the last one or more sampling with respect to the descending timing, as detection values.

11 Claims, 10 Drawing Sheets

(52) U.S. Cl.
CPC .. *H01J 37/32183* (2013.01); *H01J 37/32577* (2013.01); *H01J 37/32935* (2013.01); *H01L 21/67069* (2013.01); *H05H 1/46* (2013.01); *H01J 2237/334* (2013.01); *H05H 2001/4682* (2013.01)

(58) Field of Classification Search
CPC ........... H01J 37/32082; H01J 37/32577; H01J 37/32935; H01L 21/67069; H05H 1/46; H05H 2001/4682
See application file for complete search history.

(56) References Cited

FOREIGN PATENT DOCUMENTS

| | | |
|---|---|---|
| JP | 2007-214254 A | 8/2007 |
| JP | 2009-231683 A | 10/2009 |

* cited by examiner

| | | FREQUENCY OF PULSE SIGNAL [kHz] | | | | | |
|---|---|---|---|---|---|---|---|
| | | 5 | 10 | 15 | 20 | 30 | 40 |
| DUTY RATIO [%] | 60 | 8 | 4 | 3 | 2 | 2 | 1 |
| | 70 | 8 | 4 | 3 | 2 | 2 | 1 |
| | 80 | 8 | 4 | 3 | 2 | 2 | 1 |
| | 90 | 8 | 4 | 3 | 2 | 2 | 1 |

PLASMA PROCESSING APPARATUS AND PROBE APPARATUS

CROSS-REFERENCE TO RELATED APPLICATION

This Application is a U.S. national phase application under 35 U.S.C. § 371 of PCT Application No. PCT/JP2013/064649 filed on May 27, 2013, which claims the benefit of Japanese Patent Application No. 2012-132030 filed on Jun. 11, 2012, and U.S. Provisional Application Ser. No. 61/663,037 filed on Jun. 22, 2012, the entire disclosures of which are incorporated herein by reference.

TECHNICAL FIELD

The embodiments described herein pertain generally to a plasma processing apparatus and a probe apparatus.

BACKGROUND

Generally, in a manufacturing process for a semiconductor device, various processes such as an etching process and a film forming process is performed on a processing target substrate by generating plasma of a processing gas within a processing vessel of a plasma processing apparatus. For example, a parallel plate type plasma processing apparatus is configured to supply a processing gas into a processing vessel and apply a high frequency power to either one of an upper electrode and a lower electrode, which are provided within the processing vessel, from a high frequency power supply. As a result, plasma of the processing gas is generated in a high frequency electric field formed between an upper electrode and a lower electrode.

Further, in the parallel plate type plasma processing apparatus, a matching device is provided between the high frequency power supply and the electrode, and a high frequency power outputted from the matching device is supplied to the electrode via a power transmission line. In the parallel plate type plasma processing apparatus, by providing this matching device, an input impedance of the electrode and an output impedance of the high frequency power supply can be matched with each other, so that the plasma can be efficiently generated within the processing vessel.

A plasma state generated in the plate type plasma processing apparatus depends on electrical parameters such as a load impedance and a power, a voltage and an electric current of a high frequency power supplied to an electrode. Accordingly, if these electrical parameters are calculated and control parameters of the plasma processing apparatus are adjusted based on the electrical parameters, the plasma state can be optimized and stabilized. A plasma processing apparatus capable of calculating the electrical parameters is described in, for example, Patent Document 1.

The plasma processing apparatus described in Patent Document 1 includes a power feed rod that connects a lower electrode and a matching device; and a probe detector fastened to the power feed rod. In this plasma processing apparatus, the aforementioned electrical parameters are calculated by analyzing, through an analyzing unit, measurement signals obtained by measuring an electric current and a voltage in the power feed rod with the probe detector.

More specifically, in the plasma processing apparatus described in Patent Document 1, a high frequency power is continuously supplied from a high frequency power supply to the lower electrode. Further, detection values (i.e., sampled digital values) are obtained by continuously sampling the measurement signals of the electric current, the voltage and the like at a regular cycle.

Meanwhile, in the parallel plate type plasma processing apparatus, a high frequency power in a pulse shape may be applied to the lower electrode. That is, by turning the high frequency power ON and OFF alternately, supply of the high frequency power to the lower electrode and stop of the supply thereof are switched alternately. For example, by stopping the supply of the high frequency power to the lower electrode, a plasma sheath on a processing target substrate is extinguished, and by applying a negative voltage to the upper electrode, negative ions or electrons are supplied to the processing target substrate, so that electric charges of the processing target substrate can be neutralized. As a result, it is possible to allow positive ions to be straightly moved in a subsequent etching process for the processing target substrate.

REFERENCES

Patent Document 1: Japanese Patent Laid-open Publication No. 2009-231683

DISCLOSURE OF THE INVENTION

Problems to be Solved by the Invention

In the plasma processing apparatus described in Patent Document 1, as stated above, since the high frequency power from the high frequency power supply is continuously supplied to the lower electrode, a temporal variation of the measurement signals, which are obtained by measuring the electrical characteristics in the power feed rod with the probe detector, may be small. Accordingly, in the plasma processing apparatus described in Patent Document 1, stable detection values are obtained even when continuously sampling the measurement signals at the regular cycle.

In the plasma processing apparatus configured to turn the high frequency power ON and OFF alternately, however, since the high frequency power varies with the lapse of time, levels of the measurement signals may also be greatly varied. Accordingly, the detection values obtained by sampling the measurement signals may also be greatly varied depending on a sampling timing. As a result, the aforementioned electrical parameters may not be calculated accurately.

In view of the foregoing, in the pertinent technical field, it is required to reduce a variation in a detection value, which depends on a sampling timing of a measurement signal obtained by the probe detector from the power transmission line between the matching device and the electrode in the parallel plate type plasma processing apparatus which is configured to turn the high frequency power ON and OFF alternately.

Means for Solving the Problems

In one example embodiment, a plasma processing apparatus includes a processing vessel; a gas supply unit configured to supply a processing gas into the processing vessel; an upper electrode provided within the processing vessel; a mounting table having a lower electrode provided to face the upper electrode within the processing vessel; a high frequency power supply configured to generate a high frequency power and turn the high frequency power ON and OFF; a matching circuit provided between the high frequency power supply and either one of the upper electrode and the lower electrode; a power transmission line connected between the matching circuit and the either one of the upper electrode and the lower electrode; and a probe apparatus having a probe detector configured to measure electrical characteristics on the power transmission line and generate measurement signals, and a processing unit configured to sample the measurement signals and generate sample values. The processing unit receives a pulse signal having a first level for a period during which the high frequency power is ON and having a second level for a period during which the high frequency power is OFF, generates one or more sample values by sampling the measurement signals at a preset sampling interval for a period after the lapse of a preset mask period from an ascending timing of the pulse signal until a descending timing of the pulse signal, and selects, among the one or more sample values, one or more sample values, which are obtained through the last one or more sampling with respect to the descending timing, as detection values.

In this parallel plate type plasma processing apparatus that applies a high frequency power to the electrode in a pulse shape in which turning ON/OFF of the high frequency power is switched, it takes time until the high frequency power reaches a stable level after the high frequency power is turned ON. This time may depend on an ON/OFF switching frequency of the high frequency power. In the plasma processing apparatus of the example embodiment, the pulse signal having the first level for a period during which the high frequency power is ON and having the second level for a period during which the high frequency power is OFF is sent to the processing unit of the probe apparatus. The processing unit samples the measurement signals of the probe detector during the period after the lapse of the preset mask period from the ascending timing of the pulse of the pulse signal until the descending timing of the pulse signal, and selects, among the obtained one or more sample values, one or more sample values, which are obtained through the last one or more sampling with respect to the descending timing, as detection values. That is, in the plasma processing apparatus of the example embodiment, by using the descending timing of the pulse signal as a trigger, the one or more sample values obtained immediately before the descending timing of the pulse signal are selected as the detection values. This detection values may be values based on the measurement signals when the high frequency power in the power transmission line reaches the stable level. Accordingly, by obtaining the detection values, it is possible to reduce a variation in the detection values which depends on the sampling timing of the measurement signals which varies with the lapse of time. Further, since the detection values are obtained by using the descending timing as the trigger, a variation of the detection values that relies on the sampling timing can be still reduced even if the ON/OFF switching frequency of the high frequency power (hereinafter, referred to as "switching frequency") is varied.

In the example embodiment, the processing unit may calculate the number of sample values to be selected as the detection values, which are previously set depending on a frequency, based on an ON/OFF switching frequency of the high frequency power. In accordance with the example embodiment, the number of sample values to be selected as the detection values among the sample values obtained during the single pulse period may be previously set such that the number of sample values obtained after the lapse of a preset time period is same for multiple frequencies having different switching frequencies. Accordingly, for any of the multiple frequencies having different switching frequencies, the same number of detection values can be obtained. Thus, when the processing unit outputs an analysis value based on a multiple number of detection values, for example, it is possible to uniform an output timing of the analysis value for any of the multiple frequencies having different switching frequencies. Further, a value obtained by applying FFT (Fast Fourier Transform) to the multiple number of detection values may be used as the analysis value. Further, in the example embodiment, the plasma processing apparatus further includes a controller configured to set the ON/OFF switching frequency of the high frequency power, and the processing unit may receive information specifying the ON/OFF switching frequency of the high frequency power and calculate the number of sample values based on the received information. Further, in another example embodiment, the processing unit may calculate the ON/OFF switching frequency of the high frequency power by analyzing the pulse signal.

The plasma processing apparatus may further include a pulse controller configured to output the pulse signal to the processing unit of the probe apparatus and output a pulse signal for turning the high frequency power ON and OFF to the high frequency power supply. Moreover, the plasma processing apparatus may further include another high frequency power supply configured to generate another high frequency power which has a frequency different from a frequency of the high frequency power and which is turned ON for a period during which the high frequency power is ON and turned OFF for a period during which the high frequency power is OFF; and a matching circuit provided between the another high frequency power supply and the power transmission line and the pulse controller may output a pulse signal for turning the another high frequency power ON and OFF to the another high frequency power supply. In the plasma processing apparatus, the high frequency power may include a pulse generator configured to generate the pulse signal sent to the processing unit of the probe apparatus.

In another example embodiment, a probe apparatus generates detection values of electrical characteristics on a power transmission line of a plasma processing apparatus in which a high frequency power applied to either one of an upper electrode and a lower electrode via the power transmission line is turned ON and OFF. The probe apparatus includes a probe detector configured to measure the electrical characteristics on the power transmission line and generate measurement signals; and a processing unit configured to sample the measurement signals and generate sample values. The processing unit receives a pulse signal having a first level for a period during which the high frequency power is ON and having a second level for a period during which the high frequency power is OFF, generates one or more sample values by sampling the measurement signals at a preset sampling interval for a period after the lapse of a preset mask period from an ascending timing of the pulse signal until a descending timing of the pulse signal, and selects, among the one or more sample values, one or more sample values, which are obtained through the last one or more sampling with respect to the descending timing, as detection values. This probe apparatus is capable of reducing a variation in the detection value which depends on a sampling timing of the measurement signals which varies with the lapse of time. Further, even if the ON/OFF switching frequency of the high frequency power is changed, the variation of the detection value depending on the sampling time can still be reduced.

The processing unit may calculate the number of sample values to be selected as the detection values, which are previously set depending on a frequency, based on an ON/OFF switching frequency of the high frequency power. In accordance with the example embodiment, the number of sample values to be selected as the detection values among the sample values obtained during the single pulse period may be previously set such that the number of sample values obtained after the lapse of a preset time period is same for multiple frequencies having different switching frequencies. Accordingly, for any of the multiple frequencies having different switching frequencies, the same number of detection values can be obtained. Thus, when the processing unit outputs an analysis value based on the detection values, for example, it is possible to uniform an output timing of the analysis value for any of the multiple frequencies having different switching frequencies.

Effect of the Invention

In accordance with the example embodiments as stated above, in a parallel plate type plasma processing apparatus configured to turn a high frequency power to be applied to an electrode ON and OFF alternately, it is possible to reduce a variation in a detection value, which depends on sampling timing of measurement signals obtained by a probe detector from a power transmission line between a matching device and the electrode.

BRIEF DESCRIPTION OF THE DRAWINGS

FIG. 9 is a diagram illustrating an example table referred to by a sampling unit.

MODE FOR CARRYING OUT THE INVENTION

Figure 1:
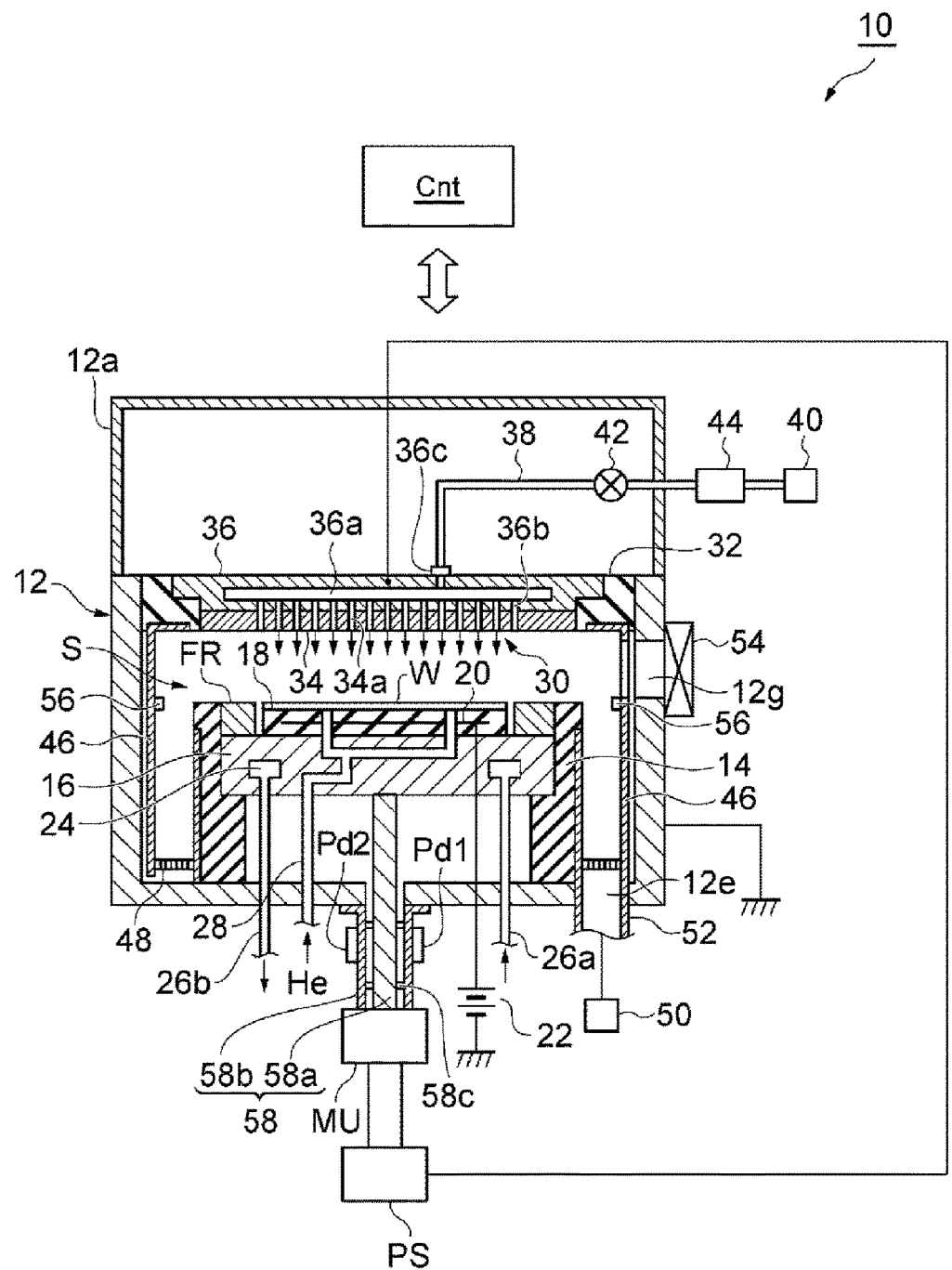
FIG. 1 is a cross-sectional view illustrating a plasma processing apparatus in accordance with an example embodiment.

Hereinafter, example embodiments will be explained with reference to the accompanying drawings. In various drawings, like or corresponding parts will be assigned like reference numerals.

FIG. 1 is a diagram illustrating a plasma processing apparatus in accordance with an example embodiment. A plasma processing apparatus 10 shown in FIG. 1 is configured as a capacitively coupled parallel plate type plasma etching apparatus and includes a substantially cylindrical processing vessel 12. The processing vessel 12 is made of, but not limited to, aluminum having an anodically oxidized surface. The processing vessel 12 is frame-grounded.

A cylindrical supporting member 14 made of an insulating material is provided on a bottom of the processing vessel 12. The supporting member 14 is configured to support a base 16 made of a metal such as, but not limited to, aluminum. The base 16 is placed within the processing vessel 12 and severs as a lower electrode in this example embodiment.

An electrostatic chuck 18 is provided on a top surface of the base 16. The electrostatic chuck 18 and the base 16 constitute a mounting table in accordance with the example embodiment. The electrostatic chuck 18 has a configuration in which an electrode 20 made of a conductive film is embedded between a pair of insulating layers or insulating sheets. The electrode 20 is electrically connected with a DC power supply 22. The electrostatic chuck 18 is configured to attract and hold a processing target substrate W thereon by an electrostatic force such as a Coulomb force generated by applying a DC voltage from the DC power supply 22.

A focus ring RF is provided on the top surface of the base 16 to surround the electrostatic chuck 18. The focus ring RF is provided to improve etching uniformity. A material for the focus ring RF may be appropriately selected depending on a material of an etching target layer. By way of example, but not limitation, the focus ring RF may be made of silicon or quartz.

A coolant path 24 is formed within the base 16. A coolant of a preset temperature, e.g., cooling water is supplied into and circulated through the coolant path 24 via pipelines 26a and 26b from an external chiller unit. A temperature of the processing target substrate W on the electrostatic chuck 18 is controlled by adjusting the temperature of the coolant.

Further, in the plasma processing apparatus 10, a gas supply line 28 is provided. A heat transfer gas, e.g., a He gas from a heat transfer gas supplying device is supplied into a gap between a top surface of the electrostatic chuck 18 and a rear surface of the semiconductor wafer W through the gas supply line 28.

Furthermore, an upper electrode 30 is provided within the processing vessel 12. The upper electrode 30 is provided above the base 16 to face the base 16. The base 16 and the upper electrode 30 are arranged substantially in parallel with each other. A processing space S in which a plasma etching process is performed on the processing target substrate W is formed between the upper electrode 30 and the lower electrode 16.

The upper electrode 30 is supported at a top portion of the processing vessel 12 via an insulating shield member 32. The upper electrode 30 may include an electrode plate 34 and an electrode supporting body 36. The electrode plate 34 faces the processing space S and has a multiple number of gas discharge holes 34a. The electrode plate 34 may be made of a semiconductor or a low-resistance conductor having low Joule heat.

The electrode supporting body 36 is configured to support the electrode plate 34 in a detachable manner and may be made of a conductive material such as, but not limited to, aluminum. The electrode supporting body 36 may have a water-cooling structure. A gas diffusion space 36a is formed within the electrode supporting body 36. A multiple number of gas through holes 36b communicating with the gas discharge holes 34a are extended downward from the gas diffusion space 36a. Further, the electrode supporting body 36 has a gas inlet opening 36c through which a processing gas is introduced into the gas diffusion space 36a, and a gas supply line 38 is connected to the gas inlet opening 36c.

The gas supply line 38 is connected to a gas source 40 via a valve 42 and a mass flow controller (MFC) 44. Here, a FCS may be used instead of the MFC. The gas source 40 is configured to supply a processing gas containing a fluorocarbon-based gas $C_xF_y$ such as, but not limited to, $C_4F_8$. The processing gas from the gas source 40 is introduced into the gas diffusion space 36a through the gas supply line 38 to be discharged into the processing space S through the gas through holes 36b and the gas discharge holes 34a. The gas source 40, the valve 42, the MFC 44, the gas supply line 38, and the upper electrode 30 having the gas diffusion space 36a, the gas through holes 36b and the gas discharge holes 34a constitute a gas supply unit in this example embodiment.

In addition, the plasma processing apparatus 10 may further include a grounding conductor 12a. The grounding conductor 12a is of a substantially cylindrical shape and is extended upward from a sidewall of the processing vessel 12 up to a position higher than the upper electrode 30.

Further, in the plasma processing apparatus 10, a deposition shield 46 is detachably provided along an inner wall of the processing vessel 12. The deposition shield 46 is also provided on an outer periphery of the supporting member 14. The deposition shield 46 is configured to suppress an etching byproduct (deposit) from adhering to the processing vessel 12 and may be made of an aluminum material coated with ceramics such as $Y_2O_3$.

A gas exhaust plate 48 is provided between the supporting member 14 and the inner wall of the processing vessel 12 at a bottom portion of the processing vessel 12. The gas exhaust plate 48 may be made of, by way of non-limiting example, an aluminum material coated with ceramics such as $Y_2O_3$. A gas exhaust opening 12e is formed under the gas exhaust plate 48 at the processing vessel 12, and a gas exhaust device 50 is connected to the gas exhaust opening 12e via a gas exhaust line 52. The gas exhaust device 50 has a vacuum pump such as a turbo molecular pump, and is capable of depressurizing the inside of the processing vessel 12 to a desired vacuum level. Further, a loading/unloading opening 12g for the processing target substrate W is formed in the sidewall of the processing vessel 12, and the loading/unloading opening 12g is opened and closed by a gate valve 54.

Further, a conductive member (GND block) 56 is provided on the inner wall of the processing vessel 12. The conductive member 56 is fastened to the inner wall of the processing vessel 12 to be located at a height position substantially same level as the processing target substrate W in a height direction. This conductive member 56 is connected to the ground in a DC manner and has an abnormal electric discharge preventing effect. Further, the location of the conductive member 56 may not be limited to the position shown in FIG. 1 as long as it is provided within a plasma generation region. By way of example, the conductive member 56 may be provided at the side of the base 16, e.g., around the base 16, or may be provided at the side of the upper electrode 30, e.g., around the upper electrode 30 in a ring shape.

In the example embodiment, the plasma processing apparatus 10 may further include a power feed rod 58 for supplying a high frequency power to the base 16 serving as the lower electrode. The power feed rod 58 constitutes a power transmission line in accordance with the example embodiment. The power feed rod 58 has a coaxial dual-pipe structure and includes a rod-shaped conductive member 58a and a cylindrical conductive member 58b. The rod-shaped conductive member 58a is extended from the outside of the processing vessel 12 to the inside of the processing vessel 12 through the bottom of the processing vessel 12 in an approximately vertical direction, and an upper end of the rod-shaped conductive member 58a is connected to the base 16. Further, the cylindrical conductive member 58b is coaxially arranged around the rod-shaped conductive member 58 to surround the rod-shaped conductive member 58 and is supported on a bottom portion of the processing vessel 12. Two sheets of insulating members 58c each having a substantially annular shape are provided between the rod-shaped conductive member 58a and the cylindrical conductive member 58b, and is configured to electrically insulate the rod-shaped conductive member 58a and the cylindrical conductive member 58b from each other.

Further, in the example embodiment, the plasma processing apparatus 10 may further include a matching device MU. Lower ends of the rod-shaped conductive member 58a and the cylindrical conductive member 58b are connected to the matching device MU. The matching device MU is connected with a power supply system PS, and the power supply system PS is also connected with the upper electrode 30. In the example embodiment, the power supply system PS is configured to supply two different high frequency powers to the base 16 and apply a DC voltage to the upper electrode 30. The power supply system PS will be elaborated later.

In the present example embodiment, the plasma processing apparatus 10 may further include a control unit Cnt. The control unit Cnt may be implemented by a computer equipped with a processor, a storage unit, an input device, a display device, and so forth. The control unit Cnt controls individual components of the plasma processing apparatus 10, e.g., a power system or a gas supply system, a driving system, the power supply system PS, and so forth. Further, the control unit Cnt includes an input device through which an operator inputs commands or the like to manage the plasma processing apparatus 10; and a display device that visually displays an operational status of the plasma processing apparatus 10. The storage unit of the control unit Cnt stores therein control programs for implementing various processes in the plasma processing apparatus 10 under the control of the processor, or programs for implementing a process in each component of the plasma processing apparatus 10 according to processing conditions, i.e., processing recipes.

Figure 2:
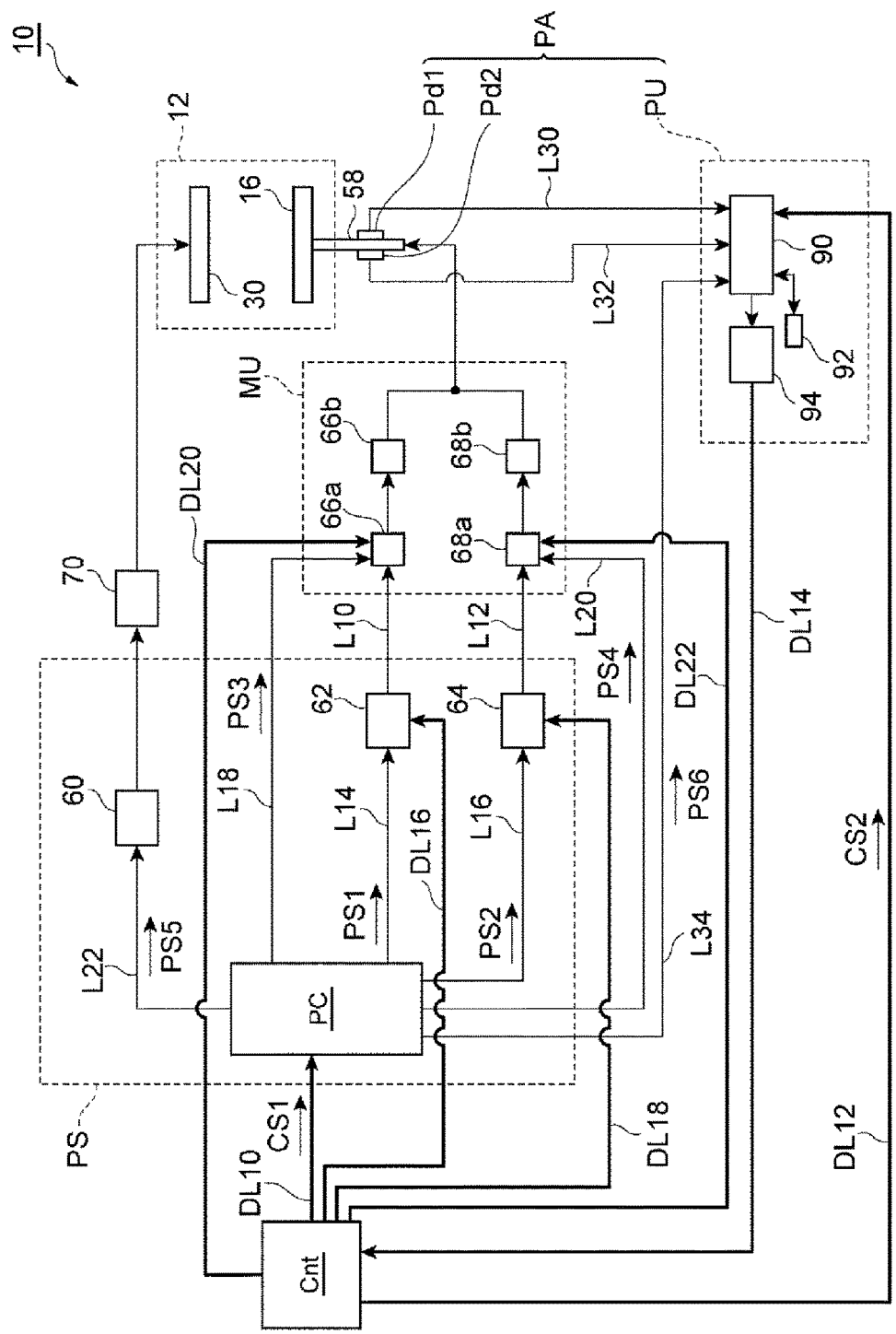
FIG. 2 is a diagram illustrating a configuration of a power supply system in accordance with the example embodiment.

Now, referring to FIG. 2, the power supply system PS will be discussed. FIG. 2 is a diagram illustrating a configuration of the power supply system PS in accordance with the example embodiment. As depicted in FIG. 2, in the example embodiment, the power supply system PS includes a DC power supply 60, a first high frequency power supply 62 and a second high frequency power supply 64.

The first high frequency power supply 62 is configured to generate a first high frequency (RF: Radio Frequency) power for plasma generation having a frequency ranging from 27 MHz to 100 MHz, e.g., 40 MHz. The first high frequency power supply 62 is connected to the matching device MU via a line L10. The matching device MU includes a matching circuit 66a, a filter circuit 66b, a matching circuit 68a and a filter circuit 68b. The first high frequency power supply 62 is connected to the matching circuit 66a, and the matching circuit 66a is connected to the power feed rod 58 via the filter circuit 66b. The matching circuit 66a is configured to match an output impedance of the first high frequency power supply 62 and an input impedance on a load side (lower electrode 16) when the first high frequency power from the first high frequency power supply 62 is ON, i.e., when the first high frequency power is being supplied to the matching circuit 66a from the first high frequency power supply 62. The filter circuit 66b serves to suppress a second high frequency power to be described later from being introduced into the matching circuit 66a.

The second high frequency power supply 64 is configured to apply a high frequency bias power to the base 16 and generate a second high frequency power for ion attraction into the processing target substrate W. A frequency of the second high frequency power is in the range from 400 kHz to 13.56 MHz, e.g., 3 MHz. The second high frequency power supply 64 is connected to the matching circuit 68a via a line L12. The matching circuit 68a is connected to the power feed rod 58 via the filter circuit 68b. The matching circuit 68a is configured to match an output impedance of the second high frequency power supply 64 and an input impedance on the load side (lower electrode 16) when the second high frequency power from the second high frequency power supply 64 is ON, i.e., when the second high frequency power is being supplied to the matching circuit 68a from the first high frequency power supply 64. The filter circuit 68b serves to suppress the first high frequency power from being introduced into the matching circuit 68a.

In the example embodiment, the power supply system PS may further include a pulse controller PC. The pulse controller PC is configured to generate pulse signals for turning ON and OFF the high frequency powers generated from the high frequency power supplies 62 an 64. The pulse controller PC is connected to the high frequency power supplies 62 and 64 via lines L14 and L16, respectively. The pulse controller PC outputs a pulse signal PS1 to the first high frequency power supply 62 via the line L14. The pulse single PS1 has a first level (e.g., high level) to turn the first high frequency power ON and has a second level (low level) to turn the first high frequency power OFF. Further, the pulse controller PC also outputs a pulse signal PS2 to the second high frequency power supply 64 via the line L16. The pulse signal PS2 also has a first level (e.g., high level) to turn the second high frequency power ON and has a second level (e.g., low level) to turn the second high frequency power OFF.

Frequencies and duty ratios of the pulse signals PS1 and PS2 generated by the pulse controller PC are adjusted by the control unit Cnt. To elaborate, the control unit Cnt outputs a control signal CS1 for setting the frequency and the duty ratio of the pulse signals to the pulse controller PC via a line DL10. In response to the control signal CS1, the pulse controller PC generates the pulse signals PS1 and PS2 each having the frequency and the duty ratio according to the corresponding control signal.

According to the pulse signal PS1 outputted from the pulse controller PC, the first high frequency power supply 62 turns the first high frequency power ON and OFF at a switching frequency corresponding to the frequency of the pulse signal PS1. Further, according to the pulse signal PS2 outputted from the pulse controller PC, the second high frequency power supply 64 also turns the second high frequency power ON and OFF at a switching frequency corresponding to the frequency of the pulse signal PS2. Accordingly, a state in which plasma exists and a state in which plasma is extinguished are alternately switched within the processing vessel 12.

In the example embodiment, the first high frequency power supply 62 may turn the high frequency power ON at a timing slightly delayed from an ascending timing of the pulse signal PS1 and turn the high frequency power OFF at a timing slightly delayed from the ascending timing of the pulse signal PS1. Likewise, the second high frequency power supply 64 may turn the high frequency power ON at a timing slightly delayed from an ascending timing of the pulse signal PS2 and turn the high frequency power OFF at a timing slightly delayed from the ascending timing of the pulse signal PS2. The delayed time period of the first high frequency power supply 62 and the second high frequency power supply 64 is a common value, and may be set in the high frequency power supplies 62 and 64.

Further, in the following description, the pulse signal PS1 outputted to the first high frequency power supply 62 and the pulse signal PS2 outputted to the second high frequency power supply 64 are in synchronization with each other. That is, phases of the pulse singles PS1 and PS2 are the same. In another example embodiment, however, a preset phase difference may be set between the pulse signals PS1 and PS2. That is, the second high frequency power may be outputted by the second frequency power supply 64 during a part of a period when the first high frequency power is being outputted from the first high frequency power supply 62. In such a case, a pulse signal PS6 to be described layer may be in synchronization with the pulse signal PS2.

Further, the pulse controller PC controls the matching circuit 66a such that a matching operation of the matching circuit 66a is synchronized with the ON-OFF switchover of the first high frequency power from the first high frequency power supply 62. Further, the pulse controller PC also controls the matching circuit 68a such that a matching operation of the matching circuit 68a is in synchronized with the ON-OFF switchover of the second high frequency power from the second high frequency power supply 64. For the purpose, the pulse controller PC is connected to the matching circuits 66a and 68a via lines L18 and L20, respectively. The pulse controller PC supplies a pulse signal PS3 to the matching circuit 66a via the line L18 and supplies a pulse signal PS4 to the matching circuit 68a via the line L20. The pulse signal PS3 may by in synchronization with the pulse signal PS1, and the pulse signal PS4 may be in synchronization with the pulse signal PS2.

Figure 3:
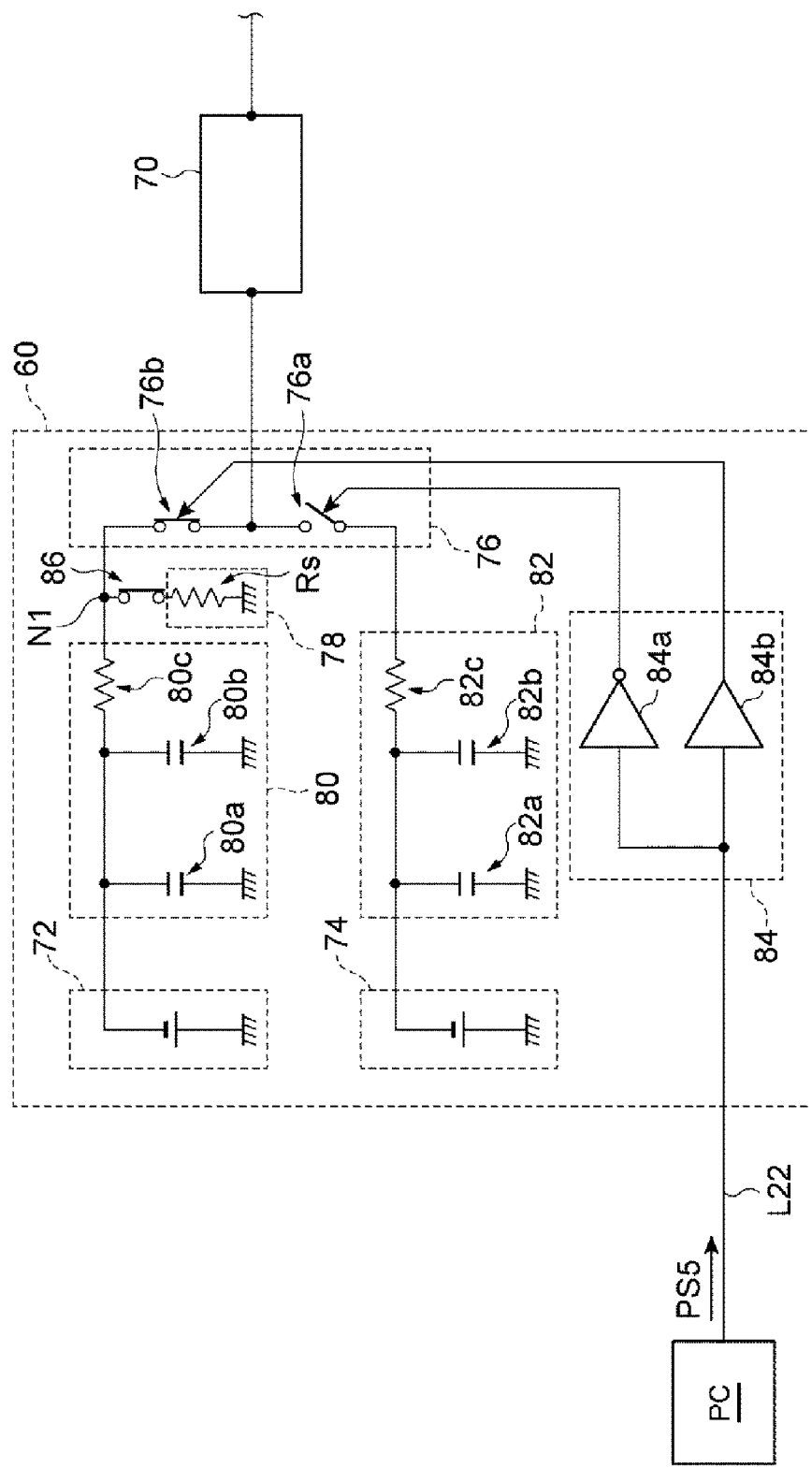
FIG. 3 is a circuit diagram illustrating a configuration of a DC power supply in accordance with the example embodiment.

Furthermore, as shown in FIG. 2, the DC power supply 60 of the power supply system PS is connected to the upper electrode 30 via a low pass filter 70. The DC power supply 60 outputs a negative DC voltage to the upper electrode 30. In the example embodiment, the DC power supply 60 is connected to the pulse controller PC via a line L22 and receives a pulse signal PS5 from the pulse controller PC via the line L22. Below, referring to FIG. 2 and FIG. 3, the DC power supply 60 will be further elaborated. FIG. 3 is a circuit diagram illustrating a configuration of the DC power supply in accordance with the example embodiment. The DC power supply 60 shown in FIG. 3 includes a first DC power supply unit 72, a second DC power supply unit 74, a selecting circuit 76, and a discharge circuit 78.

The first DC power supply unit 72 is electrically connected with the selecting circuit 76 and generates a first DC voltage which is a negative DC voltage. The first DC voltage is set to be in the range from, e.g., 0 V to −800 V. In the present example embodiment, a circuit unit 80 for stabilizing the value of the first DC voltage is provided between the first DC power supply unit 72 and the selecting circuit 76. The circuit unit 80 includes capacitors 80a and 80b and a resistor element 80c. One end of the resistor element 80c is connected to the first DC power supply unit 72 and the other end of the resistor element 80c is connected to the selecting circuit 76. Further, one ends of the capacitors 80a and 80b are connected to a ground potential, and the other ends thereof are connected to nodes between the first DC power supply unit 72 and the resistor element 80c, respectively. Each of the capacitors 80a and 80b has a capacitance of, e.g., 1 μF, and the resistor element 80c has a resistance of, e.g., 50Ω.

The second DC power supply unit 74 is electrically connected with the selecting circuit 76 and generates a second DC voltage which is a negative DC voltage. An absolute value of the second DC voltage is larger than an absolute value of the first DC voltage. The second DC voltage may be set to be lower than, e.g., −2000 V. A circuit unit 82 for stabilizing the value of the second DC voltage is provided between the second DC power supply unit 74 and the selecting circuit 76. The circuit unit 82 includes capacitors 82a and 82b and a resistor element 82c. One end of the resistor element 82c is connected to the second DC power supply unit 74, and the other end of the resistor element 82c is connected to the selecting circuit 76. One ends of the capacitors 82a and 82b are connected to the ground potential, and the other ends thereof are connected to nodes between the second DC power supply unit 74 and the resistor element 82c, respectively. Each of the capacitors 82a and 82b has a capacitance of, e.g., 1 μF, and the resistor element 82c has a resistance of, e.g., 50Ω.

The selecting circuit 76 is configured to selectively connect either the first DC power supply unit 72 or the second DC power supply unit 74 to the upper electrode 30. In the present example embodiment, the selecting circuit 76 has two switch devices 76a and 76b. Each of the switch devices 76a and 76b includes a first terminal, a second terminal and a control terminal. The first terminal of the switch device 76b is electrically connected with the first DC power supply unit 72, and the first terminal of the switch device 76a is electrically connected with the second DC power supply unit 74. The second terminal of the switch device 76a and the second terminal of the switch device 76b are electrically connected with each other, and a node between these first and second terminals is connected to the upper electrode 30 via the low pass filter 70. The low pass filter 70 is configured to trap the high frequency powers from the first and second high frequency power supplies 62 and 64 and may be implemented by, but not limited, to a LR filter or a LC filter.

The control terminal of the switch device 76a and the control terminal of the switch device 76b are connected to the pulse controller PC via a circuit unit 84. The circuit unit 84 includes an inverting circuit 84a connected to the switch device 76a and a non-inverting circuit 84b connected to the switch device 76b. The pulse signal PS5 outputted from the pulse controller PC is sent to the inverting circuit 84a and the non-inverting circuit 84b of the circuit unit 84. The inverting circuit 84a sends an inverted signal of the pulse signal PS5 to the control terminal of the switch device 76a. Meanwhile, the non-inverting circuit 84b sends a non-inverted signal of the pulse signal PS5 to the control terminal of the switch device 76b. Accordingly, the selecting circuit 76 may selectively connect the first DC power supply unit 72 to the upper electrode 30 for a period during which the first high frequency power supply 62 outputs the first high frequency power, and may selectively connect the second DC power supply unit 74 to the upper electrode 30 for a period during which the first high frequency power supply 62 does not output the first high frequency power.

Further, in the example embodiment, the pulse signal PS5 outputted from the pulse controller PC to the DC power supply 60 is in synchronization with the pulse signals PS1 and PS2 outputted from the pulse controller PC to the high frequency power supplies 62 and 64, respectively. In another example embodiment, a preset phase difference may be set between the pulse signal PS5 and the pulse signal PS1. That is, a preset phase difference may be set between the pulse signal PS1 and the pulse signal PS5 such that the first DC power supply unit 72 is selectively connected to the upper electrode 30 for a part of the period during which the first high frequency power supply 62 outputs the first high frequency power whereas the second DC power supply unit 74 is selectively connected to the upper electrode 30 for a part of the period during which the first high frequency power supply 62 does not output the first high frequency power.

In the present example embodiment, as depicted in FIG. 3, the DC power supply 60 further includes the discharge circuit 78. The discharge circuit 78 is connected to a node N1 between the first DC power supply unit 72 and the selecting circuit 76. Specifically, the node N1 is positioned between the input terminal of the switch device 76b and the circuit unit 80. The discharge circuit 78 is configured to discharge electric charges accumulated in the processing vessel 12 with respect to the ground potential when a DC power supply unit to be connected to the upper electrode 30 is switched from the second DC power supply unit 74 to the first DC power supply 72. In the present example embodiment, as shown in FIG. 3, the discharge circuit 78 has a resistor element Rs. One end of the resistor element Rs is connected to the ground potential, and the other end thereof is connected to the node N1. The resistor element Rs has a resistance in the range from, e.g., 50Ω to 100 kΩ. For example, the resistor element Rs may have a resistance of, e.g., 200Ω.

As stated above, in the plasma processing apparatus 10, the electric charges accumulated in the processing vessel 12 are rapidly discharged through the discharge circuit 78 when the DC power supply unit to be connected to the upper electrode 30 is switched from the second DC power supply unit 74 to the first DC power supply unit 72. Accordingly, when the DC power supply unit to be connected to the upper electrode 30 is switched from the second DC power supply unit 74 to the first DC power supply unit 72, an output voltage of the DC power supply 60 is controlled to the first DC voltage rapidly. Therefore, the output voltage of the DC power supply 60 can keep up with the switchover of the negative DC voltages having different absolute values to be applied to the upper electrode 30. In another example embodiment, the discharge circuit 78 may be implemented by a constant current circuit.

In addition, as depicted in FIG. 3, in the present example embodiment, the DC power supply 60 may further include a switch circuit 86. The switch circuit 86 is provided between the discharge circuit 78 and the node N1. The switch circuit 86 is configured to connect the discharge circuit 78 to the node N1 selectively. Specifically, when connecting the first DC power supply unit 72 and the second DC power supply unit 74 to the upper electrode 30 alternately, the discharge circuit 78 can be connected to the node N1 by closing the switch circuit 86. Meanwhile, when connecting either one of the first DC power supply unit 72 and the second DC power supply unit 74 to the upper electrode 30 continuously, the discharge circuit 78 can be disconnected from the node N1 by opening the switch circuit 86.

To perform an etching process in the plasma processing apparatus 10 having the above-described configuration, a processing target substrate W is mounted on the electrostatic chuck 18. The processing target substrate W may have an etching target layer and a resist mask formed on the etching target layer. While evacuating the processing vessel 12 by the gas exhaust device 50, a processing gas from the gas source 40 is supplied into the processing vessel 12 at a preset flow rate, and an internal pressure of the processing vessel 12 is set to be in the range from, e.g., 0.1 Pa to 50 Pa. A gas containing a halogen element, represented by a fluorocarbon-based gas $C_xF_y$ such as $C_4F_8$, may be used as the processing gas. The processing gas may further include another gas such as an Ar gas or an $O_2$ gas.

Figure 4:
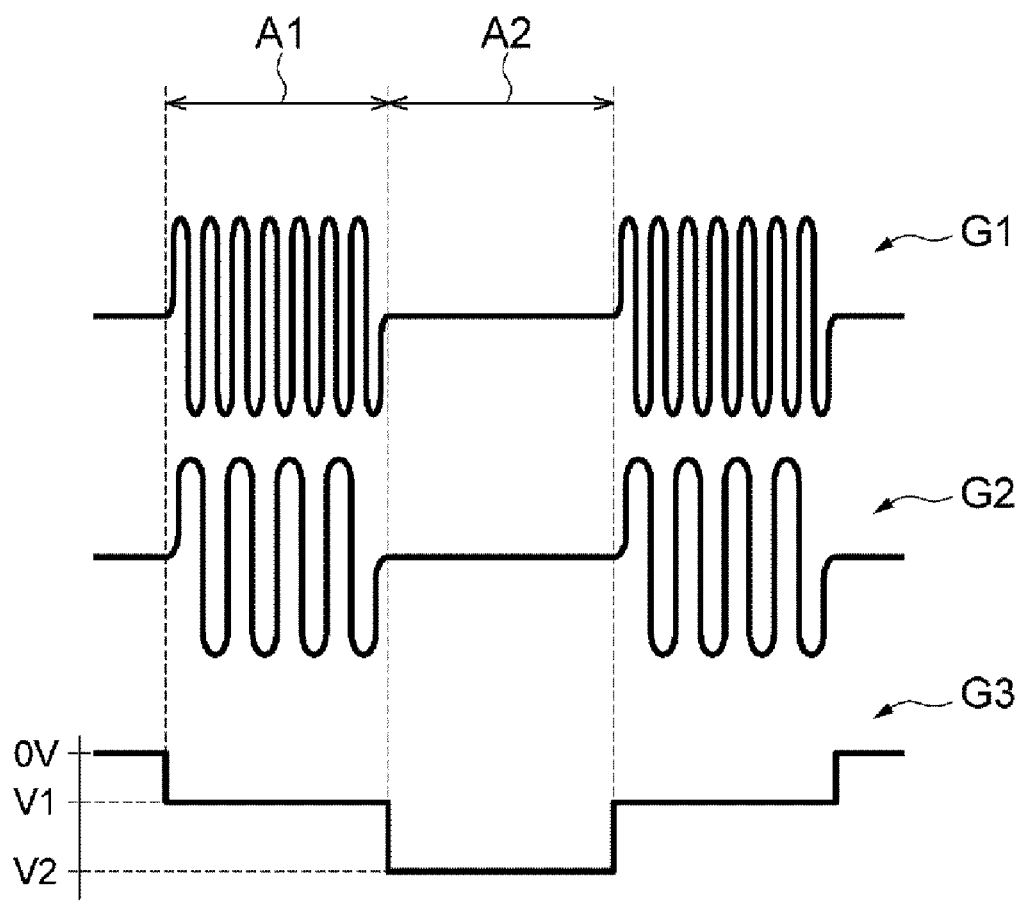
FIG. 4 is a timing chart illustrating an example waveform of an output of a high frequency power supply and an example waveform of an output voltage of the DC power supply.

Then, in response to a pulse signal PS1 having a high level, the first high frequency power supply 62 supplies a first high frequency power (refer to a waveform G1 of FIG. 4) to the lower electrode 16 during a period A1, as shown in FIG. 4. Further, in response to a pulse signal PS2 having a high level, the second high frequency power supply 64 supplies a second high frequency power (refer to a waveform G2 of FIG. 4) to the lower electrode 16 during the period A1. Further, in response to a pulse signal PS5 having a high level, the DC power supply 60 supplies a first DC voltage V1 (refer to a waveform G3 of FIG. 4) to the upper electrode 30. As a result, a high frequency electric field is formed between the upper electrode 30 and the lower electrode 16, so that the processing gas supplied into the processing space S is excited into plasma. The etching target layer of the processing target substrate W is etched by positive ions or radicals in the plasma.

Thereafter, in response to the pulse signal PS1 having a low level, the first high frequency power supply 62 stops the supply of the first high frequency power supply (refer to the waveform G1 of FIG. 4) during a period A2. Further, in response to the pulse signal PS2 having a low level, the second high frequency power supply 64 stops the supply of the second high frequency power (refer to the waveform G2 of FIG. 4) during the period A2. Furthermore, in response to the pulse signal PS5 having a low level, the DC power supply supplies a second DC voltage V2 (refer to the waveform G3 of FIG. 4) to the upper electrode 30. As a result, during the second period A2, a plasma sheath on the processing target substrate W is extinguished or decreased. In this state, secondary electrons generated when the positive ions within the processing space S is collided with the upper electrode 30 are accelerated toward and irradiated to the processing target substrate W. Accordingly, a charging state of the processing target substrate W is neutralized and the resist mask may be modified (reformed). As a consequence, plasma resistance of the resist mask may be enhanced and vertical movement of ions contributing to the etching performance would be improved, so that selectivity for the etching target layer and vertical profile of a hole formed in the etching target layer may be improved.

Referring back to FIG. 1 and FIG. 2, the plasma processing apparatus 10 further includes a probe apparatus PA. The probe apparatus PA includes probe detectors Pd1 and Pd2; and a processing unit PU. The probe detectors Pd1 and Pd2 are configured to measure electrical characteristics in the power transmission line connected between the lower electrode 16 and the high frequency power supplies 62 and 64, i.e., the power feed rod 58 in the present example embodiment, and also configured to output measurement signals. The probe detectors Pd1 and Pd2 may be fastened to, for example, the cylindrical conductive member 58b. In the present example embodiment, the probe detector Pd1 may be a current probe detector configured to measure an electric current flowing in the rod-shaped conductive member 58a of the power feed rod 58, and the probe detector Pd2 may be a voltage probe detector configured to measure a voltage in the rod-shaped conductive member 58a of the power feed rod 58. The probe detectors Pd1 and Pd2 may measure the electric current or the voltage by being in direct contact with the rod-shaped conductive member 58a or may measure an electrostatic surface potential of the rod-shaped conductive member 58a in a non-contact manner using an electrostatic capacitance. Further, the probe detectors Pd1 and Pd2 may also be configured to measure a progressive wave power and a reflection wave power in the power feed rod 58, or the probe apparatus PA may further include another probe detector configured to measure the progressive wave power and the reflection wave power.

The probe detectors Pd1 and Pd2 are connected to the processing unit PU. In the present example embodiment, the processing unit PU may include a sampling unit 90, a storage unit 92 and an analyzing unit 94. The sampling unit 90 is connected to the probe detectors Pd1 and Pd2 via lines L30 and L32, respectively. The sampling unit 90 receives the measurement signals from the probe detectors Pd1 and Pd2 through the lines L30 and L32, respectively. Further, the sampling unit 90 is also connected to the pulse controller PC via a line L34 and receives a pulse signal P6 from the pulse controller PC trough the line L34. The pulse signal PS6 has a first level (e.g., high level) for a period during which the first high frequency power or the second high frequency power is ON, whereas the pulse signal PS6 has a second level (e.g., low level) for a period during which the first high frequency power supply or the second high frequency power supply is OFF. In the present example embodiment, the pulse signal PS6 may be in synchronization with the pulse signal PS1. Further, the sampling unit 90 may be connected to the control unit Cnt via a line DL12. The sampling unit 90 may receive information CS2, which specifies a frequency and a duty ratio of a pulse signal set for the pulse controller PC by the control unit Cnt, through the line DL12.

Figure 5:
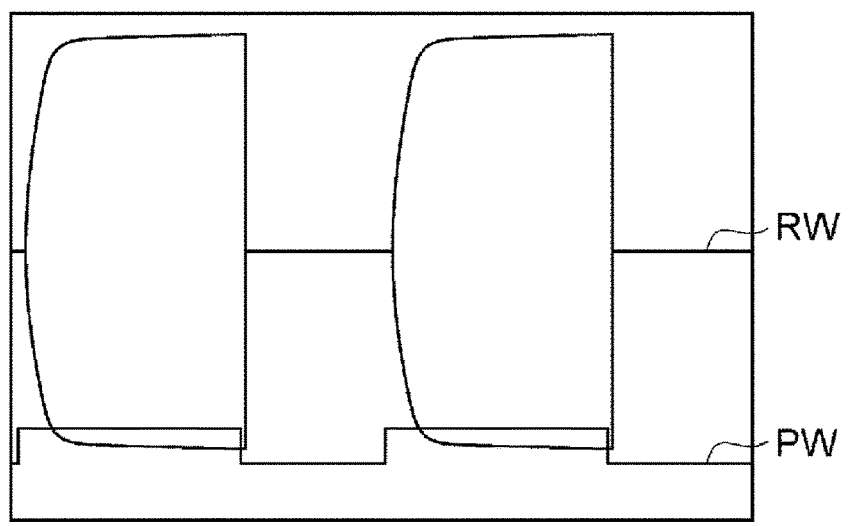
FIG. 5 is a diagram illustrating an example waveform of a measurement signal of a probe detector and an example waveform of a pulse signal applied to a processing unit of a probe apparatus.
Figure 6:
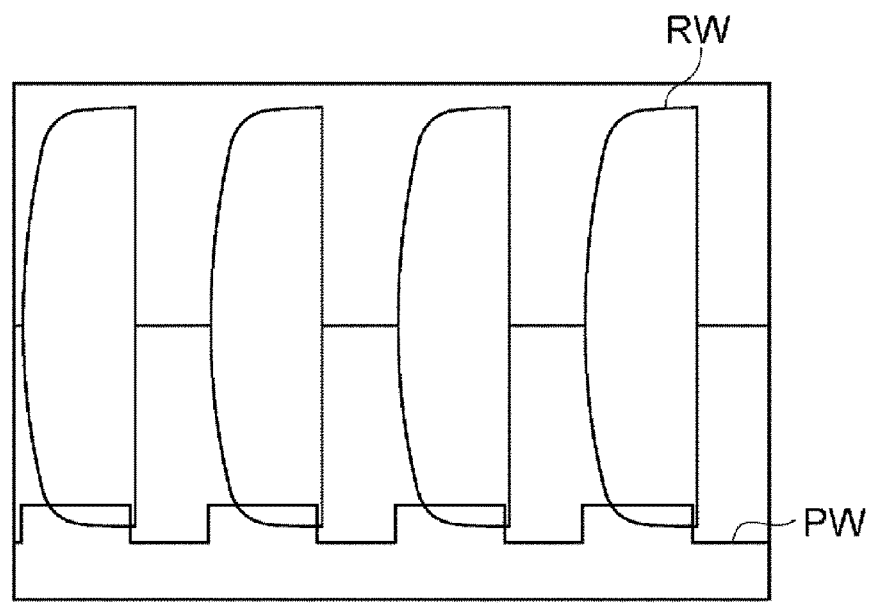
FIG. 6 is a diagram illustrating an example waveform of a measurement signal of the probe detector and an example waveform of a pulse signal applied to the processing unit of the probe apparatus.
Figure 7:
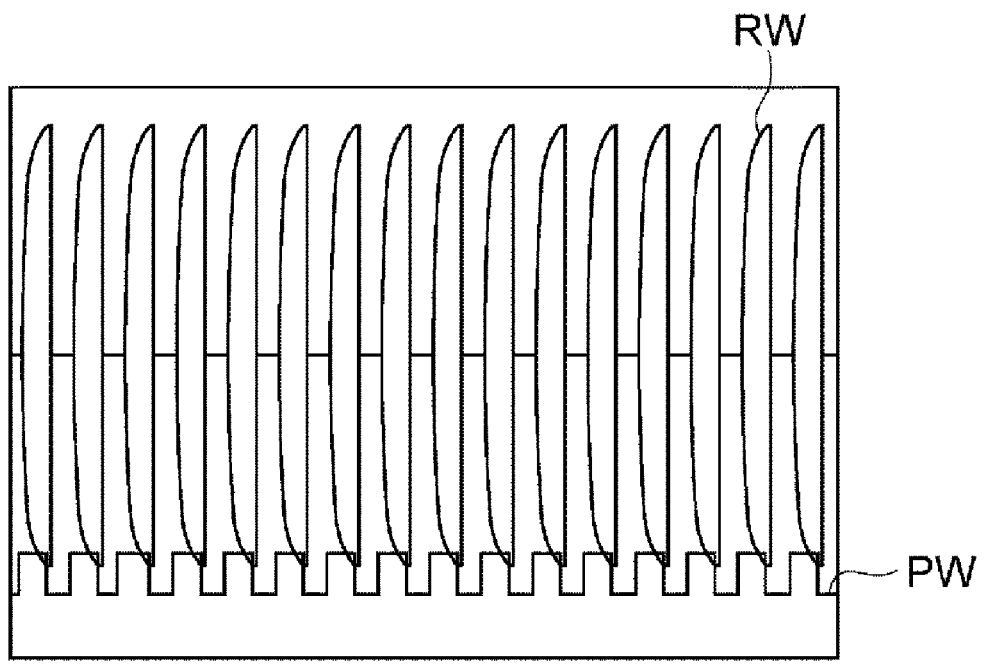
FIG. 7 is a diagram illustrating an example waveform of a measurement signal of the probe detector and an example waveform of a pulse signal applied to the processing unit of the probe apparatus.

FIG. 5 to FIG. 7 illustrate waveforms of a measurement signal of a probe detector and waveforms of the pulse single PS6 sent to the processing unit PU of the probe apparatus PA. FIG. 5 depicts a waveform PW of the pulse signal PS6 having a frequency of 5 kHz and a duty ratio (on-duty) of 60%, and waveforms RW of the measurement signals when the pulse signals PS1 and PS2 in synchronization with the pulse signal PS6 are applied to the high frequency power supplies 62 and 64, respectively. FIG. 6 depicts a waveform PW of the pulse signal PS6 having a frequency of 10 kHz and a duty ratio (on-duty) of 60%, and waveforms RW of the measurement signals when the pulse signals PS1 and PS2 in synchronization with the pulse signal PS6 are applied to the high frequency power supplies 62 and 64, respectively. FIG. 7 depicts a waveform PW of the pulse signal PS6 having a frequency of 40 kHz and a duty ratio (on-duty) of 60%, and waveforms RW of the measurement signals when the pulse signals PS1 and PS2 in synchronization with the pulse signal PS6 are applied to the high frequency power supplies 62 and 64, respectively. In each drawing of FIG. 5 to FIG. 7, an envelope curve is provided for the waveform RW, whereas a straight-line graph is provided for the waveform PW.

As shown in FIG. 5 to FIG. 7, since an electrical characteristic in the power feed rod 58 is varied depending on the pulse signals PS1 and PS2, the measurement signal (refer to the waveform RW) measured by the probe detector is also varied. Further, as shown in FIG. 5 to FIG. 7, the electrical characteristic in the power feed rod 58, i.e., a level of the measurement signal measured by the probe detector increases after an ascending timing of the pulse signals PS1 and PS2 and reaches a certain level with the elapsed time from the ascending timing. Accordingly, sample values obtained by continuously sampling the measurement signals at a certain sampling interval may be greatly varied. When these sample values, which fluctuate greatly, are used as detection values, it is difficult to calculate a proper electrical parameter for the plasma processing apparatus 10.

Figure 8A:
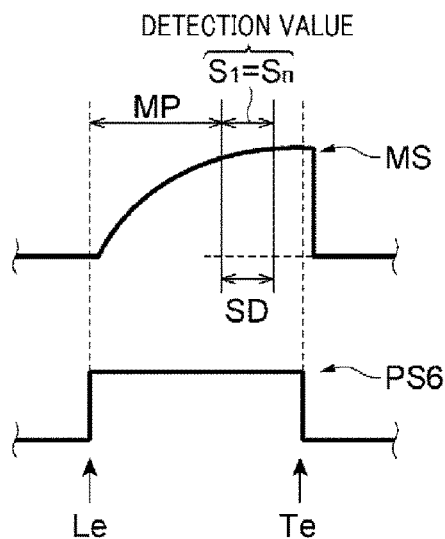
FIG. 8A and FIG. 8B are diagrams for describing a method of acquiring a detection value in accordance with the example embodiment.
Figure 8B:
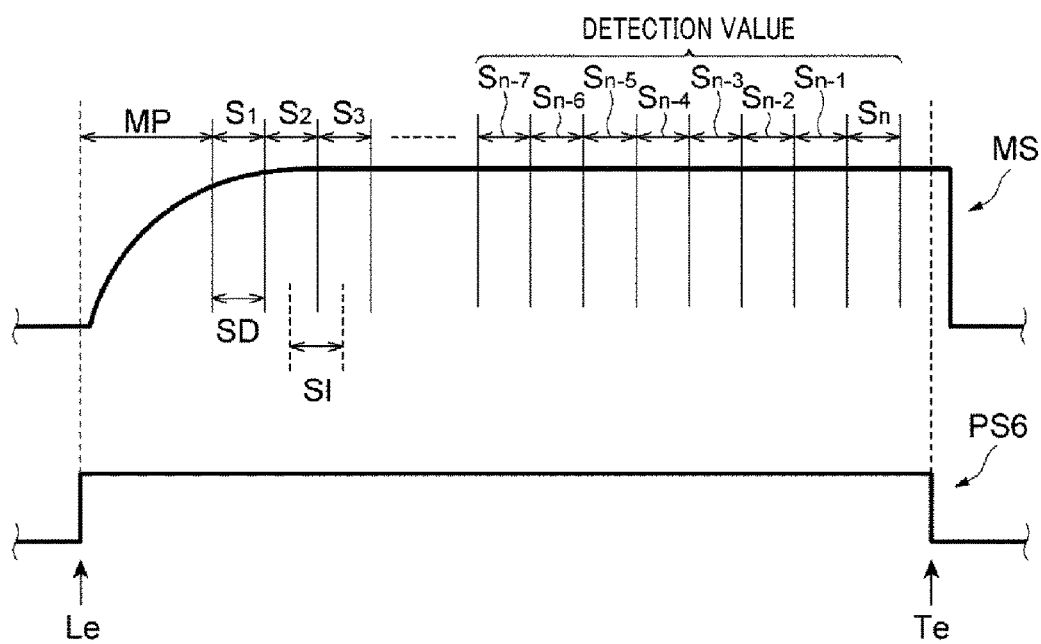

In view of the foregoing, in the processing unit PU of the plasma processing apparatus 10, a detection value is acquired as will be described below with reference to FIG. 8A and FIG. 8B. FIG. 8A and FIG. 8B are diagrams for describing a method of acquiring a detection value in accordance with the example embodiment. FIG. 8A depicts a measurement signal MS of the probe detector when the pulse signal PS6 in synchronization with the pulse signal PS1 having a frequency of 40 kHz and a duty ratio of 60%, the pulse signal PS1 and the pulse signal PS2 are sent to the high frequency power supplies 62 and 64. FIG. 8B depicts a measurement signal MS of the probe detector when the pulse signal PS6 in synchronization with the pulse signal PS1 having a frequency of 5 kHz and a duty ratio of 60%, the pulse signal PS1 and the pulse signal PS2 are sent to the high frequency power supplies 62 and 64.

The pulse signal PS6 in synchronization with the pulse signal PS1 as described above is inputted to the sampling unit 90 of the processing unit PU. The sampling unit 90 starts sampling of the measurement signals MS after the lapse of a preset mask period MP from an ascending timing Le of the inputted pulse signal PS6, and then, continues the sampling until a descending timing Te of the corresponding pulse signal as shown in FIG. 8A and FIG. 8B. The preset mask period MP may be a parameter maintained in the sampling unit 90 or may be set for the sampling unit 90 by the control unit Cnt. Further, a period taken for the sampling unit 90 to acquire a single sample value Si, i.e., a sampling period SD and an interval between consecutive sampling periods, i.e., a sampling interval SI may also be parameters maintained in the sampling unit 90 or may be set for the sampling unit 90 by the control unit Cnt. Further, in the present example embodiment, the sampling interval SI is a time interval having the same length as the sampling period SD.

The sampling unit 90 in configured to store sample values obtained during the single pulse in the storage unit 92 as stated above. Among the sample values $S_i$ obtained for the single pulse and stored in the storage unit 92, the sampling unit 90 selects a sample value, which is obtained through the last one or more sampling with respect to the descending timing Te of the corresponding pulse, as a detection value. Accordingly, the sampling unit 90 can select a sample value having reached a certain level after the ascending timing Le as the detection value. Therefore, the sampling unit 90 may suppress the detection value which relies on the sampling timing of the measurement signal from being varied greatly.

Further, in the present example embodiment, the sampling unit 90 may select a preset number of sample values as detection values among the sample values obtained during the single pulse period. The preset number may depend on the frequency of the pulse signal PS1, i.e., the switching frequency. For the purpose, as mentioned above, the control unit Cnt receives the information CS2, which specifies the frequency and the duty ratio of the pulse signal PS1 set for the pulse controller PC through the line DL12. Then, the sampling unit 90 calculates the number of sample values based on the specified frequency and the duty ratio on the information CS2.

In this regard, in the present example embodiment, a table TB shown in FIG. 9 is stored in the storage unit 92. As depicted in FIG. 9, in the table TB, the number of sample values to be selected as detection values is set in correspondence to the frequency and the duty ratio of the pulse signal. In this example embodiment, the number of sample values to be selected as detection values, as recorded in the table TB, is set such that the number of detection values obtained after the lapse of a certain period is same regardless of the frequency and the duty ratio of the pulse signal PS1.

By referring to the table TB, the sampling unit 90 specifies the number of sample values to be selected based on the specified frequency and the duty ratio on the information CS2. Then, among the sample values obtained during the single pulse period, the sampling unit 90 selects the specified number of sample values, which are the last one or more sample values with respect to the descending timing Te of the corresponding pulse, as detection values.

To elaborate, for example, when the pulse signal PS1 has a frequency of 40 kHz and a duty ratio (on-duty) of 60%, the sampling unit 90 specifies that the number of sample values to be selected as detection values is "1" by referring to the table TB (see FIG. 9). Further, when the pulse signal PS1 has the frequency of 40 kHz and the duty ratio of 60%, a period during which the single pulse has a first level (e.g., high level) is 15 μsec. In this case, if the mask period MP is set to 10 μsec and the sampling period SD (i.e., the sampling interval SI) is set to 5 μsec, only one sample value $S_1$ is obtained during the single pulse period of the pulse signal PS6 in synchronization with the pulse signal PS1, as shown in FIG. 8A. In this case, the sampling unit 90 selects the sample value $S_1$, i.e., the last single sample value $S_n$ as a detection value.

Further, when the pulse signal PS1 has a frequency of 5 kHz and a duty ratio (on-duty) of 60%, the sampling unit 90 specifies that the number of sample values to be selected as detection values is "8" by referring to the table TB. Further, when the pulse signal PS1 has the frequency of 5 kHz and the duty ratio of 60%, a period during which the single pulse has a high level is 120 μsec. In this case, if the mask period MP is set to 10 μsec and the sampling period SD (i.e., the sampling interval SI) is set to 5 μsec, twenty two (22) sample values $S_1$ to $S_{22}$ are obtained during the single pulse period of the pulse signal PS6 in synchronization with the pulse signal PS1, as shown in FIG. 8B. In this case, the sampling unit 90 selects the last eight sample values $S_n$ to $S_{n-7}$ as detection values among the sample values $S_1$ to $S_n$.

The number of sample values to be selected as detection values, which are set in the table shown in FIG. 9, is set such that the number of detection values obtained after the lapse of a certain period is same regardless of the frequency and the duty ratio of the pulse signal PS1. By way of example, when the pulse signal PS1 has the frequency of 40 kHz and the duty ratio (on-duty) of 60%, a single detection value is obtained during a single cycle of 25 μsec, and a total number of one thousand and twenty four (1024) detection values are obtained during a preset period, i.e., 25.6 msec. Further, when the pulse single PS1 has the frequency of 5 kHz and the duty ratio (on-duty) of 60%, eight (8) detection values are obtained during a single cycle of 200 μsec, and a total number of one thousand and twenty four (1024) detection values are obtained during the preset period, i.e., 25.6 msec. In this way, by setting the number of detection values to be selected as detection values, it is possible to acquire the same number of detection values during a certain period regardless of the frequency and the duty ratio of the pulse signal PS1.

In the example embodiment, the analyzing unit 94 of the processing unit PU acquires the detection values outputted from the sampling unit 90. Then, by performing a preset analysis process on the acquired detection values, the analyzing unit 94 calculates electrical parameters of the plasma processing apparatus 10. By way of example, the electrical parameters may include a load impedance, and a voltage, an electric current and a power of each of the frequency of the first high frequency power and the frequency of the second high frequency power. To calculate these electrical parameters, the analyzing unit 94 may apply FFT (Fast Fourier Transform) to the acquired detection values. The electrical parameters obtained by the analyzing unit 94 are based on the preset number of detection values, and, as stated above, the sampling unit 90 is capable of outputting the same number of detection values during the preset period of time. Accordingly, the analyzing unit is capable of calculating the electrical parameters at a regular update speed regardless of the frequency and the duty ratio of the pulse single PS1.

In the example embodiment, the analyzing unit 94 sends the obtained electrical parameters to the control unit Cnt via a line DL14. If the electrical parameters are received, the control unit Cnt outputs control signals to the first high frequency power supply 62, the second high frequency power supply 64, the matching circuit 66a and the matching circuit 68a via lines DL16, DL18, DL20 and DL22, respectively. By outputting these control signals, the control unit Cnt is capable of controlling a power value of the first high frequency power, a power value of the second high frequency power and a magnitude of capacitive reactance components of the matching circuits 66a and 66b of the matching device MU. Accordingly, plasma can be optimized and stabilized in the plasma processing apparatus 10.

In the above, various example embodiments have been described. However, the example embodiments are not intended to be limiting, and various modifications may be made. For example, in the example embodiment shown in FIG. 2, the sampling unit 90 determines the number of sample values to be selected as detection values by specifying the frequency and the duty ratio of the pulse signal based on the information CS sent from the control unit Cnt. However, the analyzing unit 94 may calculate a frequency and a duty ratio of the pulse signal PS6 by analyzing the pulse signal PS6, and may determine the number of sample values to be selected as detection values based on the calculated frequency and duty ratio.

Further, in the above-described example embodiment, both of the two high frequency power supplies are connected to the lower electrode 16. However, the first high frequency power supply may be connected to either one of the lower electrode 16 and the upper electrode 30, and the second high frequency power supply may be connected to the other one of them. Moreover, the DC power supply 60 may include only a single DC power supply unit, and ON/OFF operations of the single DC power supply unit may be controlled based on the pulse signal PS5.

Figure 10:
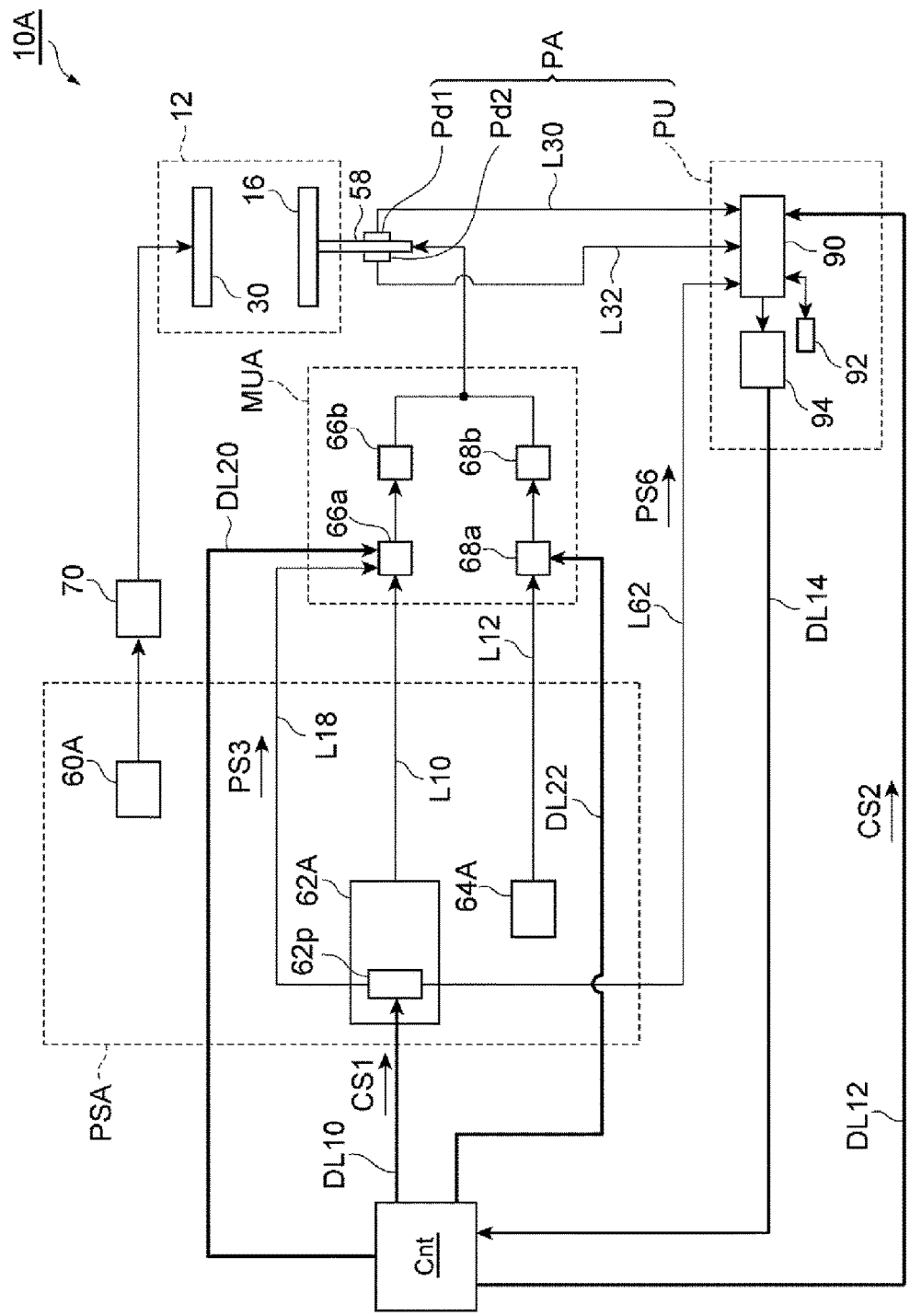
FIG. 10 is a diagram illustrating a configuration of a power supply system in accordance with another example embodiment.

In addition, in the above-described example embodiment, both of the high frequency powers of the two high frequency power supplies 62 and 64 are turned ON and OFF. In another example embodiment, however, one high frequency power of either one of the two high frequency power supplies may be turned ON and OFF. An example of such another example embodiment is illustrated in FIG. 10. FIG. 10 depicts a power supply system in accordance with another example embodiment. A plasma processing apparatus 10A shown in FIG. 10 does not have the pulse controller PC, and, instead, a pulse generator 62p is provided within a first high frequency power supply 62A.

The pulse generator 62p is configured to turn a first high frequency power ON and OFF at a switching frequency and a duty ratio based on the control signal CS1 outputted from the control unit Cnt via a line DL10. In this example embodiment, a second high frequency power supply 64A is configured to continuously output a high frequency power, and a preset DC voltage is continuously applied to the upper electrode 30 from a DC power supply 60A. Further, the pulse generator 62p generates a pulse signal PS3 having a switching frequency and a duty ratio based on the control signal CS1 and sends the pulse signal PS3 to a matching circuit 66a via a line L18. Furthermore, the pulse generator 62p also generates a pulse signal PS6 having a switching frequency and a duty ratio based on the control signal CS1 and sends the pulse signal PS6 to the sampling unit 90 via a line L62. The sampling unit 90 may acquire a detection value based on this pulse signal PS6, as in the plasma processing apparatus 10.

As still another example, the first high frequency power supply 62A may be configured to continuously output a high frequency power, and the second high frequency power supply 62B may have a pulse generator which is the same as the pulse generator 62p. In this configuration, a high frequency power of the second high frequency power supply 64A may be switched ON and OFF. In this another example, a pulse signal PS4 and a pulse signal PS6 may be applied to the matching circuit 68a and the sampling unit 90, respectively, from the pulse generator of the second high frequency power supply 64A.

EXPLANATION OF REFERENCE NUMERALS

10: Plasma processing apparatus
12: Processing vessel
16: Base (Lower electrode)
18: Electrostatic chuck
30: Upper electrode
40: Gas source
58: Power feed rod (Power transmission line)
PS: Power supply system
60: DC power supply
62: First high frequency power
64: Second high frequency power
MU: Matching device
66a: Matching circuit
68a: Matching circuit
PA: Probe apparatus
Pd1, Pd2: Probe detector
PU: Processing unit
90: Sampling unit
92: Storage unit
94: Analyzing unit
Cnt: Control unit
PC: Pulse controller
W: Processing target substrate

We claim:
1. A plasma processing apparatus, comprising:
a processing vessel;
a gas supply unit configured to supply a processing gas into the processing vessel;
an upper electrode provided within the processing vessel;
a mounting table having a lower electrode provided to face the upper electrode within the processing vessel;

a pulse controller configured to output a pulse signal;
a first high frequency power supply configured to generate a first high frequency power and turn the first high frequency power ON and OFF;
a matching circuit provided between the first high frequency power supply and either one of the upper electrode and the lower electrode;
a power transmission line connected between the matching circuit and the either one of the upper electrode and the lower electrode; and
a probe apparatus having a probe detector configured to measure electrical characteristics on the power transmission line and generate corresponding measurement signals, and a processing unit configured to sample the measurement signals and generate sample values,
wherein the processing unit is configured to receive the pulse signal, wherein the pulse signal has a first level for a period during which the first high frequency power is ON and having a second level which is lower than the first level, for a period during which the first high frequency power is OFF,
wherein the processing unit is configured to generate the sample values while the pulse signal is at the first level by sampling the measurement signals at a preset sampling interval, the sampling starting after lapse of a preset mask period from an ascending timing at which a level of the pulse signal is changed from the second level to the first level and ending at or before a descending timing at which the level of the pulse signal is changed from the first level to the second level, and selects a preset number of detection values among the sample values, including the last one or more sample values with respect to the descending timing.

2. The plasma processing apparatus of claim 1, wherein the pulse controller is configured to output the pulse signal to the processing unit of the probe apparatus and output a pulse signal for turning the first high frequency power ON and OFF to the first high frequency power supply.

3. The plasma processing apparatus of claim 2, further comprising:
a second high frequency power supply configured to generate a second high frequency power which has a second frequency different from a first frequency of the first high frequency power and which is turned ON for a period during which the first high frequency power is ON and turned OFF for a period during which the first high frequency power is OFF; and
a matching circuit provided between the second high frequency power supply and the power transmission line,
wherein the pulse controller outputs a pulse signal for turning the second high frequency power ON and OFF to the second high frequency power supply.

4. The plasma processing apparatus of claim 1, wherein the first high frequency power comprises a pulse generator configured to generate the pulse signal.

5. The plasma processing apparatus according to claim 1, wherein the preset number depends on information that specifies a frequency and a duty ratio of the pulse signal.

6. The plasma processing apparatus according to claim 1, wherein a waveform of the measurement signals has a curved leading edge.

7. The plasma processing apparatus according to claim 1, further comprising a control unit configured to use the detection values to control power of the first high frequency power.

8. The plasma processing apparatus according to claim 1, wherein a sampling period is a period taken to acquire a single sample and a duration of the mask period is greater than a duration of the sampling period.

9. The plasma processing apparatus according to claim 1, wherein a sampling period is a period taken to acquire a single sample, wherein the sampling period and sampling interval have the same length.

10. The plasma processing apparatus according to claim 1, wherein the pulse signal is synchronized with a power control pulse signal that turns the first high frequency ON and OFF.

11. The plasma processing apparatus according to claim 1, wherein the detection values are selected from sample values acquired where the measurement signal does not greatly vary.

* * * * *